US005385635A

United States Patent [19]

O'Neill

[11] Patent Number: 5,385,635

[45] Date of Patent: Jan. 31, 1995

[54] PROCESS FOR FABRICATING SILICON CHANNEL STRUCTURES WITH VARIABLE CROSS-SECTIONAL AREAS

[75] Inventor: James F. O'Neill, Penfield, N.Y.

[73] Assignee: Xerox Corporation, Stamford, Conn.

[21] Appl. No.: 143,774

[22] Filed: Nov. 1, 1993

[51] Int. Cl.[6] ............ H01L 21/306

[52] U.S. Cl. ............ 156/647; 156/644; 156/651; 156/661.1; 347/65

[58] Field of Search ............ 156/644, 647, 651, 653, 156/657, 659.1, 661.1, 662, 646; 347/65

[56] References Cited

U.S. PATENT DOCUMENTS

| | | | |
|---|---|---|---|
| Re. 32,572 | 1/1988 | Hawkins et al. | 156/626 |
| 4,774,530 | 9/1988 | Hawkins | 346/140 R |
| 4,810,557 | 3/1989 | Blonder | 156/647 |
| 4,863,560 | 9/1989 | Hawkins | 156/644 |
| 4,875,968 | 10/1989 | O'Neill et al. | 156/647 |
| 4,899,178 | 2/1990 | Tellier | 156/647 |
| 5,096,535 | 3/1992 | Hawkins et al. | 156/633 |
| 5,131,978 | 7/1992 | O'Neill | 156/644 |
| 5,141,596 | 8/1992 | Hawkins et al. | 156/647 |
| 5,204,690 | 4/1993 | Lorenze, Jr. et al. | 156/647 |
| 5,277,755 | 1/1994 | O'Neill | 156/651 |

FOREIGN PATENT DOCUMENTS 524204 2/1993 Japan .

*Primary Examiner*—George Fourson
*Assistant Examiner*—Thomas G. Bilodeau
*Attorney, Agent, or Firm*—Robert A. Chittum

[57] ABSTRACT

Three dimensional silicon structures having variable depths such as ink flow channels and reservoirs are fabricated from silicon wafers by a two-step anisotropic etching process from a single side of the wafer. Two different etching masks are formed one on top of the other prior to the initiation of etching with the coarsest mask formed last and used first. Once the coarse anisotropic etching is completed, the coarse etch mask is removed and the finer anisotropic etching is accomplished through the remaining mask. The shape of the mask for the finer anisotropic etching in combination with a predetermined etch time produces a channel having varying depths and widths by controlled undercutting of the mask by the finer anisotropic etching. The preferred embodiment is described using an ink flow directing part of a thermal ink jet printhead where the coarse etching step provides the reservoir and the timed fine etching step provides the ink channels having varying cross-sectional flow areas.

8 Claims, 11 Drawing Sheets

PROCESS FOR FABRICATING SILICON CHANNEL STRUCTURES WITH VARIABLE CROSS-SECTIONAL AREAS

BACKGROUND OF THE INVENTION

This invention relates to a process for fabricating channel recess structures in silicon wafers having variable cross-sectional areas, and more particularly to a single side, two step anisotropic etching process which uses etch mask patterns that cause controlled undercutting by the anisotropic etchant to produce channel recesses having predetermined variable cross-sectional areas useful, for example, in the production of ink jet printheads.

In the semiconductor industry, it is frequently desirable to generate large recesses or holes in association with relatively shallow recesses, which may or may not interconnect. For example, an ink jet printhead may be made of a silicon channel plate and a heater plate. Each channel plate has a relatively large ink reservoir with an open bottom, such as a recess etched entirely through the silicon substrate or wafer, and a set of parallel, shallow, elongated channel recesses. One end of the channel recesses are placed into communication with the reservoir and the other ends are opened to serve as droplet ejecting nozzles. When aligned and bonded to a heater plate containing selectively addressable heating elements, the recesses in the channel plate become the ink reservoir and ink flow-directing channels, as described more thoroughly in U.S. Pat. No. Re. 32,572 to Hawkins et al. As recognized by the Hawkins reference, a fundamental physical limitation of anisotropic etching of silicon or orientation dependent etching (ODE), as it is sometimes referred to, is that {111} crystal planes etch very slowly, while all other crystal planes etch rapidly. Consequently, only rectangles can be etched in (100) silicon material or wafers with a high degree of precision.

U.S. Pat. No. 4,774,530 to Hawkins discloses a two-part ink jet printhead comprising a mated channel plate and a heater plate, which sandwiches a thick film insulative layer that was previously deposited on the heater plate and patterned to provide an ink bypass recess for ink flow from the reservoir to the channels and recesses or pits over each heating element for placement of the heating elements in pits to prevent the vapor bubbles from blowing out the nozzles and causing ingestion of air. This is a typical ink jet printhead configuration and is discussed later with respect to FIG. 1

U.S. Pat. No. 4,863,560 to Hawkins discloses a three dimensional silicon structure, such as an ink jet printhead, fabricated from (100) silicon wafers by a single side, multiple step ODE etching process. All etching masks are formed one on top of the other prior to the initiation of etching, with the coarsest mask formed last and used first. Once the coarse anisotropic etching is completed, the coarse etch mask is removed and the finer anisotropic etching is done. The same anisotropic etchant of KOH is used for both coarse and fine etching. Since the coarse etch mask material is silicon nitride and the fine etch mask material is thermally grown silicon dioxide, erosion of the silicon dioxide in KOH must be taken into account and the silicon dioxide mask made appropriately thick.

U.S. Pat. No. 5,096,535 to Hawkins et al. discloses the fabrication of a printhead, wherein each of the ink channels is formed by segmenting the channel mask into a series of closely adjacent vias, such that during the subsequent anisotropic etching of the silicon wafer, the thin walls between the segments are eroded away before the completion of the etching step to produce the channels from the connected segments. Thus, mask alignment errors that would cause the channels to be greatly widened when the channel are one long recess are greatly reduced.

As is well known, the geometrical parameters and/or configurations of the ink flow paths in ink jet printheads determine the frequency of the droplet ejection and thus the printing speed. For example, some of the important geometrical parameters are the size of the nozzles relative the cross-sectional areas of the channels, and size of the ink flow area at the entrance to the channel relative to the nozzles, for these dimensions influence capillary refill times from the ink supply in printhead reservoir. However, because of the constraints on the anisotropic etching of silicon, the channels in printheads generally have substantially uniform cross-sectional areas. Therefore, there is a need for more flexibility in the design and fabrication of silicon channel structures in ink jet printheads.

SUMMARY OF THE INVENTION

It is the object of this invention to provide a method for forming three dimensional structures in planar silicon substrates during a single fine anisotropic etching step by controlled undercutting of the mask subsequent to a coarse anisotropic etching step on a single side of the silicon substrate.

In the present invention, a three-dimensional structure is fabricated from a (100) silicon wafer having a predetermined thickness and two opposing substantially parallel surfaces. The fabricating method comprises the steps of forming a first layer of etch resistant material, such as, thermally grown silicon dioxide on both surfaces of the wafer. Patterning the first layer of etch resistant material on one of the wafer surfaces to delineate a plurality of sets of parallel elongated channel vias and at least one reservoir via for each set of channels. Each channel via has opposing ends and sides and has opposing via extensions of predetermined size extending in opposite directions from each channel side at a predetermined location. The reservoir via is located adjacent one end of a set of channel vias. Each of the vias expose the surface of the wafer for subsequent fine or tightly toleranced etching of recesses in the wafer surface. A second layer of etch resistant material, such as silicon nitride, is deposited on both sides of the wafer and over the first layer of etch resistant materials and the vias therein. The second layer of etch resistant material is patterned on the same wafer surface as that of the first layer. The patterning of the second layer of etch resistant material produces at least one reservoir via within the boundary of each of the reservoir vias in the first layer of etch resistant material. Thus, the vias in the second layer of etch resistant material are each within respective boundaries of the vias in the first layer, so as to protect the first etch resistant material from the first etchant. The wafer is then placed into an anisotropic etchant, such as KOH, to etch coarsely through the wafer to produce reservoir recesses in the wafer. The second layer of etch resistant material is then removed from both sides of the wafer to expose the first layer of etch resistant material and the vias therein. The wafer is next placed in a second anisotropic etchant, such as KOH or EDP, for a predetermined time period, to produce relatively shallow, fine channel recesses in the exposed wafer surface through the vias in the first layer of the etch resistant material. The extensions on the opposing sides of each channel recess causes the second etchant to etch along the {111} crystal planes, so that the second etchant etches under the etch resistant material in opposing directions towards the channel recess ends. Thus, the extensions in the vias enable the channel cross-sectional area intermediate the channel ends to be enlarged, and the wafer is removed within a predetermined time period to stop the etching under the first layer of etch resistant material and produce the desired shape of the channel recesses.

In an alternate embodiment, the enlarged channel portion and the opposing channel ends is etched concurrently with the reservoir recess. Thus, the channels will be formed by a series of three vias in the first layer of etch resistant material with the center via being larger. The second layer of etch resistant material will also have a center channel via within the boundary of the via in the first layer of etch resistant material. After the coarse etch, the enlarged portion of the channels are etched concurrently with the reservoir, and the second layer of etch resistant material is removed. The other channel vias on opposing ends of the coarsely etched center portion are spaced closely adjacent thereto, so that the thin wall segment separating the two opposing end channel recesses from the previously etched center channel recess are eroded away to cause the last finely etched channel recesses to become connected to and continuous with the previously etched center portion.

In another embodiment, the enlarged channel central portion intermediate the opposing channel end portions are concurrently etched with the reservoir recess by a first coarse etching step. The channels remain segmented into separate center and end portion recesses after the first coarse etching. The walls separating the channel portion recesses are etched away by the second fine etching step. Thus, each of the channels will be formed by a single channel via in the first layer of etch resistant material, and each channel via will have opposing ends and sides with opposing via extensions of predetermined size attending in opposite directions from each channel side at a predetermined location. The second layer of etch resistant material will have a series of three vias within the boundary of each channel via in the first layer of etch resistant material and a reservoir via within the boundary of the reservoir via in the first layer of etch resistant material. As in the other embodiments, the boundaries between the vias in the respective layers of etch resistant material protect the first etch resistant material from the first etchant. After coarsely anisotropically etching the wafer to produce the reservoir recesses and the segment channel recesses, the second etch resistant mask is removed from both sides of the wafer to expose the first layer of etch resistant material and the vias therein. The wafer is next placed in a second anisotropic etchant for a predetermined time period to remove the segmented channel walls and finish etching the fine or tightly toleranced channels. The extensions on the opposing sides of each channel recess causes the second etchant to etch along the {111} crystal planes and thereby undercutting the etch resistant material in opposing directions towards the channel recess ends. The wafer is removed within a predetermined time period to stop the undercutting and produce the desired shape of the channel recesses.

The foregoing features and other objects will become apparent from a reading of the following specification in conjunction with the drawings, wherein like parts have the same index numerals.

DESCRIPTION OF THE PREFERRED EMBODIMENT

Figure 1:
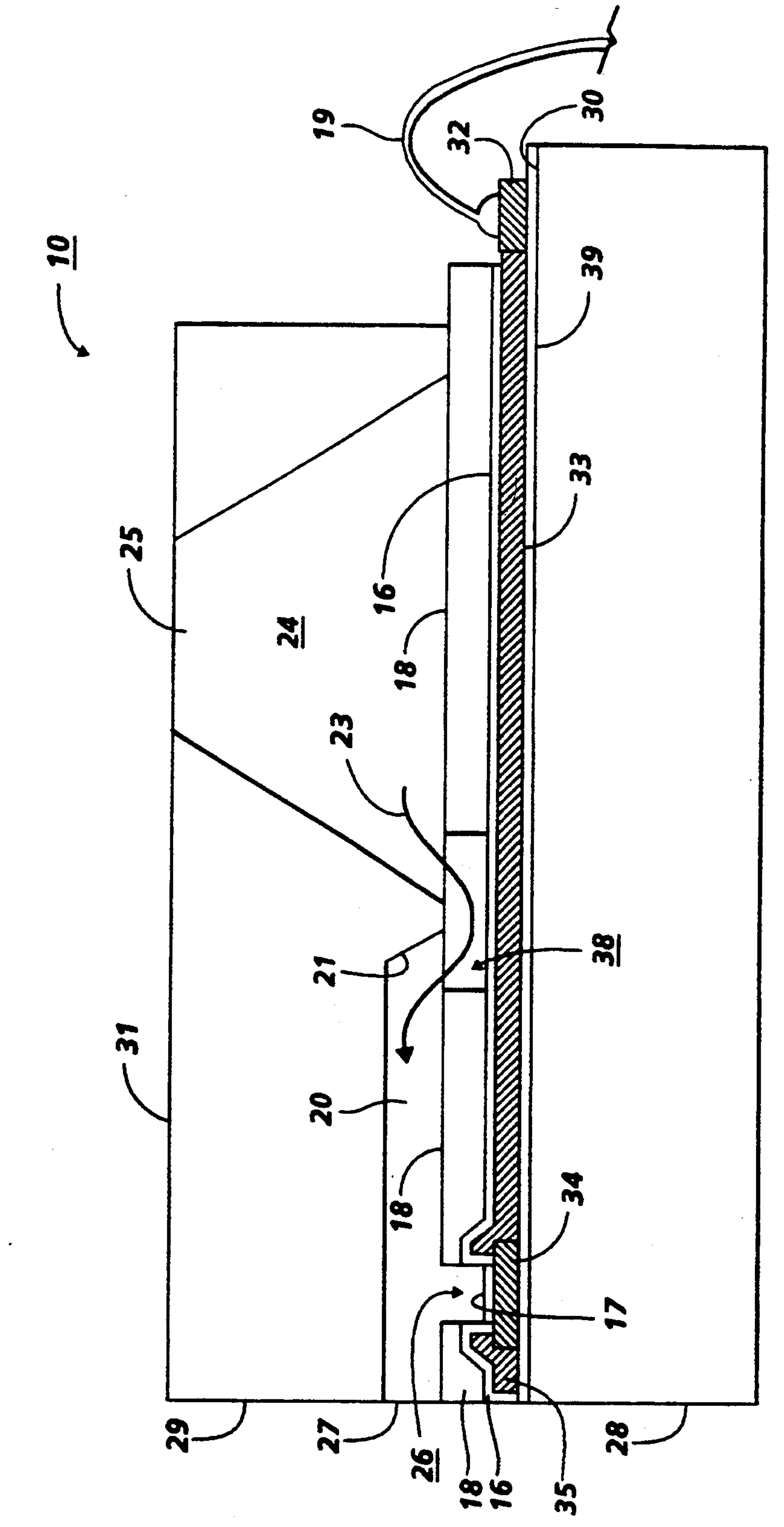
FIG. 1 PRIOR ART
FIG. 1 is an enlarged, cross-sectional view of a typical ink jet printhead showing the electrode passivation and ink flow path between the ink reservoir and the ink channels.
Figure 2:
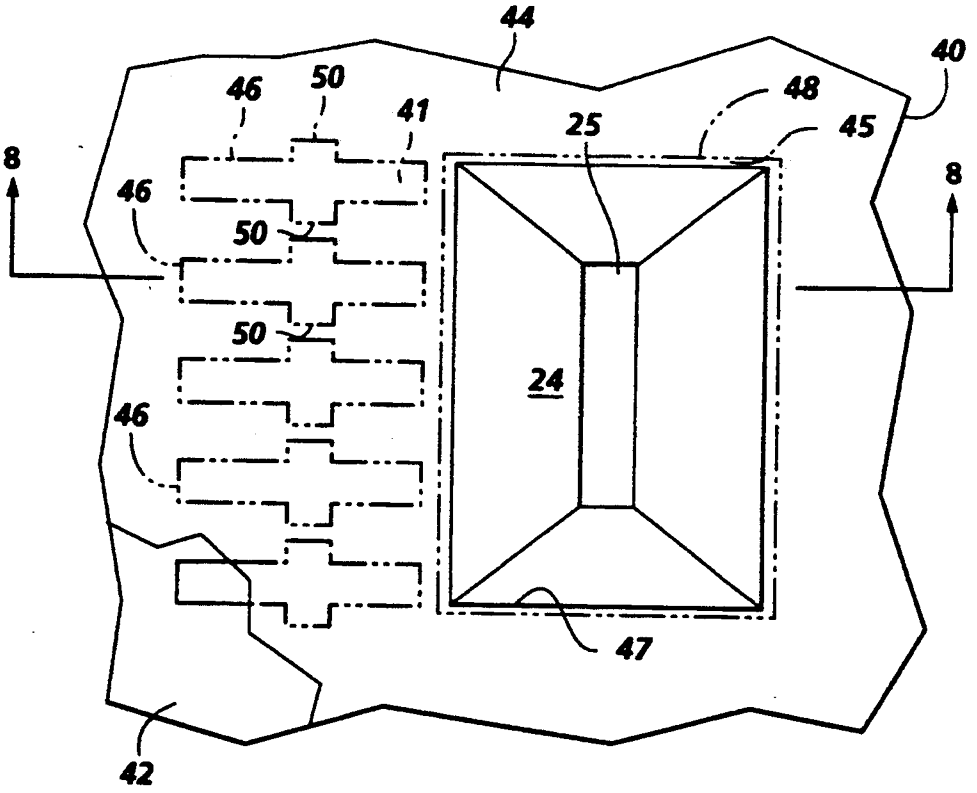
FIG. 2 is a partially shown plan view of the wafer after completion of the coarse etching of the reservoir recess and removal of the coarse etch mask in accordance with fabrication process of the present invention.

Referring to the typical prior art printhead shown in FIG. 1, a heating element plate 28 has the heating elements 34 and addressing electrodes 33 patterned on the surface 30 thereof (with integral driver circuitry not shown), while the channel plate 31 has parallel grooves 20 which extend in one direction and penetrate through the front face or edge 29. The other end of the grooves terminate at a slanted wall 21 which is adjacent recess 24 that is etched through the channel plate and is used as the ink supply reservoir for the capillary filled ink channels 20. The open bottom 25 of the reservoir recess serves as an ink fill hole. The surface of the channel plate with the grooves are aligned and bonded to the heater plate 28, so that a respective one of the plurality of heating elements 34 is positioned in each channel formed by the grooves and the heater plate. Ink enters the reservoir formed by the recess 24 and the heater plate 28 through the filled hole 25, and by capillary action fills the channels 20 by flowing through either an elongated recess or bypass pit 38 formed in a thick film insulative layer 18 sandwiched between the heating element plate and the channel plate. The ink (not shown) at each nozzle forms a meniscus, the surface tension of which, together with the slightly negative ink pressure, prevents the ink from weeping from the nozzles. The addressing electrodes and circuitry (not shown) on the heater plate 28 have terminals 32 for the attachment of wire bonds 19 that connect to the printer circuit boards (not shown). The plurality of sets of heating elements 34, their addressing electrodes 33, driver circuitry (not shown), and common return 35 are patterned on an underglaze layer 39, such as silicon dioxide. After the fabricating of the heating elements, addressing electrodes 33, and driver circuitry, and common return 35, they are passivated by a typical passivation layer 16. The passivation layer is removed from the heating elements 34 and electrode terminals 32, and a thick film layer 18 is deposited and patterned to provide the bypass trench or pits 38, and to place the heaters in pits 26. For a more detailed discussion of the prior art printhead in FIG. 1, refer to U.S. Pat. No. 4,774,530 to Hawkins, incorporated herein by reference. In accordance with U.S. Pat. No. 4,863,560 to Hawkins, also incorporated herein by reference, the three-dimensional silicon structure of the present invention incorporates both large, coarse features and small, precise features. Using a channel wafer as a typical three dimensional silicon structure to be fabricated by the present invention process, the channel wafer is a (100) silicon wafer fabricated by a two step sequential anisotropic etching process, wherein all lithography is conducted prior to the first etch step. In FIG. 2, a simplified schematical plan view of a portion of a silicon wafer 40 is shown having two sequentially formed etch masks 42, 44 formed on surface 41 thereof. Precise three-dimensional structures in silicon, having both shallow and deep recesses, may be formed by sequential anisotropic etching processes. The two masks are respectively deposited on both sides of wafer 40 and patterned on one side or surface 41 of the silicon wafer. The top mask is for the deeper or coarser anisotropic etching. The first etching is followed by stripping of the outer coarse, etch mask, and then a next anisotropic, fine etching step is performed. The sequential etching is accomplished by conducting the deepest or coarsest etch first, and then proceeding successively from the coarsest to the finest etched features of the structure. After the coarse etch, the coarse mask is stripped exposing the next fine mask, followed by the fine anisotropic etch. The tightly toleranced, fine or precise features are better preserved and protected by the coarser etch mask.

Figure 3:
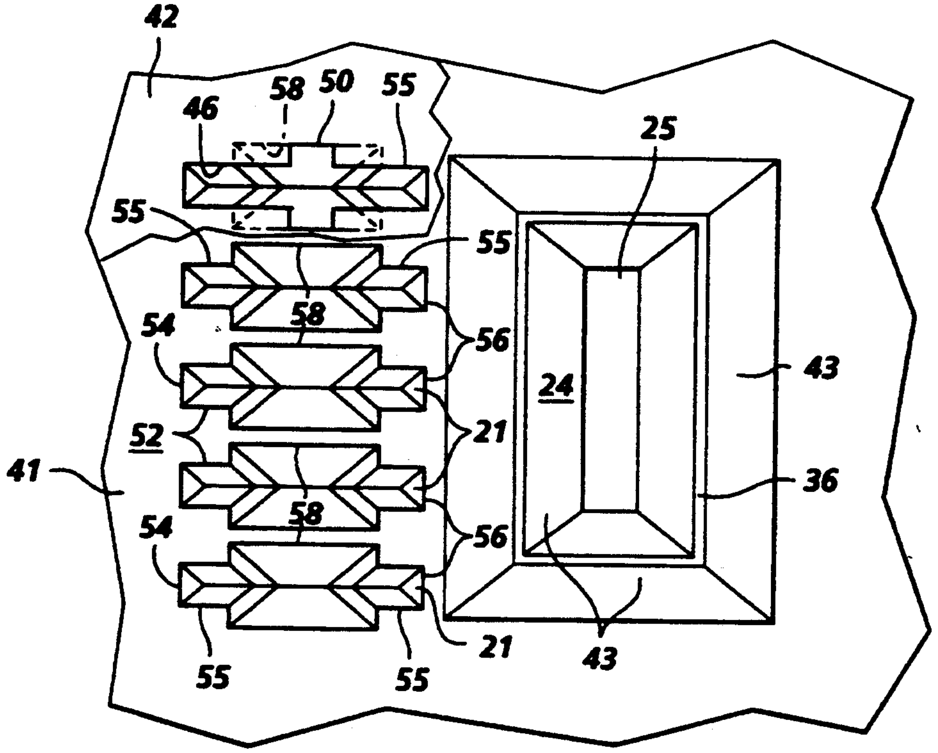
FIG. 3 is a partially shown plan view of FIG. 2 after the fine etching of the channel recesses and removal of most of the fine etch mask.
Figure 8:
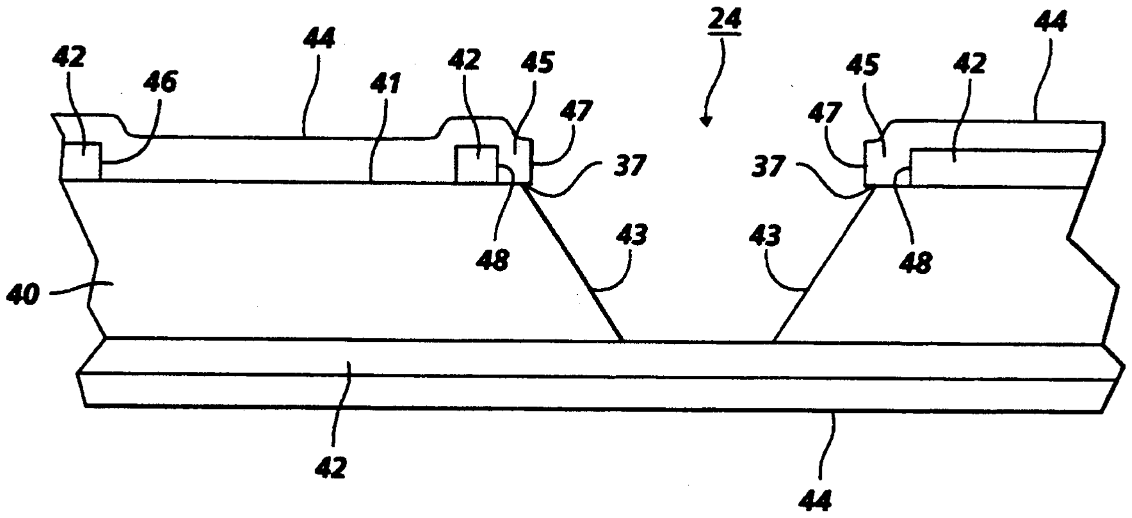
FIG. 8 is a cross-sectional view of the channel wafer as viewed along view line 8—8 in FIG. 2.

Referring to FIGS. 2 and 8, where FIG. 8 is a cross-sectional view as viewed along section line 8—8 in FIG. 2, a (100) silicon wafer 40 is partially shown with a thermally grown oxide layer ($SiO_2$) 42 on both sides, which is about 5000–7500 angstroms thick. It is lithographically processed to form a reservoir via 48 and channel vias 46 therein, both shown in dashed line in FIG. 2. Via 48 enables the production of the final shape and dimension of the reservoir 24 by the second anisotropic etching step, and a plurality of channel vias 46 enables the production of the ink channels. The border 45 of silicon wafer surface 41 is etched by the second etchant to produce shelf 36. The time period in the second anisotropic etchant is determined to complete the channel recesses and this time period is short enough to prevent the etching of the reservoir border from etching through the wafer, thereby producing shelf 36. Referring to FIG. 3., each channel has opposing ends 54, 56 and sides 55, and have opposing via extensions 50 of predetermined size extending in opposite directions from each channel side 55 at a predetermined location therealong. Channel end 56 is adjacent the reservoir via 48. Although FIGS. 2 and 3 show only five (5) channel vias 46 with extensions 50, there are 300 or more per inch in an actual printhead. The small number of channel vias shown is for ease of explanation, it being understood that the same principles apply for an actual printhead. A second mask layer 44 of silicon nitride ($Si_3N_4$) is then deposited over the patterned silicon dioxide ($SiO_2$) layer and exposed silicon wafer surface 41. The thickness of the silicon nitride layer is sufficient to assure adequate robustness to prevent handling damage during subsequent processing steps, such as, for example, 0.1–0.2 micrometers. The silicon nitride layer 44 is then lithographically processed to produce via 47, so that the via 47 exposes the bare silicon surface 41 of wafer 40. Note that a border 45 of silicon nitride (See FIG. 8) is left about 8–25 $\mu m$ wide inside of the silicon dioxide via 48, both for protection of erodable $SiO_2$ mask and of such dimension as to prevent the slight undercutting of the silicon nitride layer by the coarse etchant from reaching the $SiO_2$ mask. When the wafer is placed in a first or coarse anisotropic etchant, the silicon is etched where exposed by via 47 to form reservoir recesses 24. Because of the size of the via 47 and the time period in the etchant, the reservoir recess is etched through the wafer.

Figure 4:
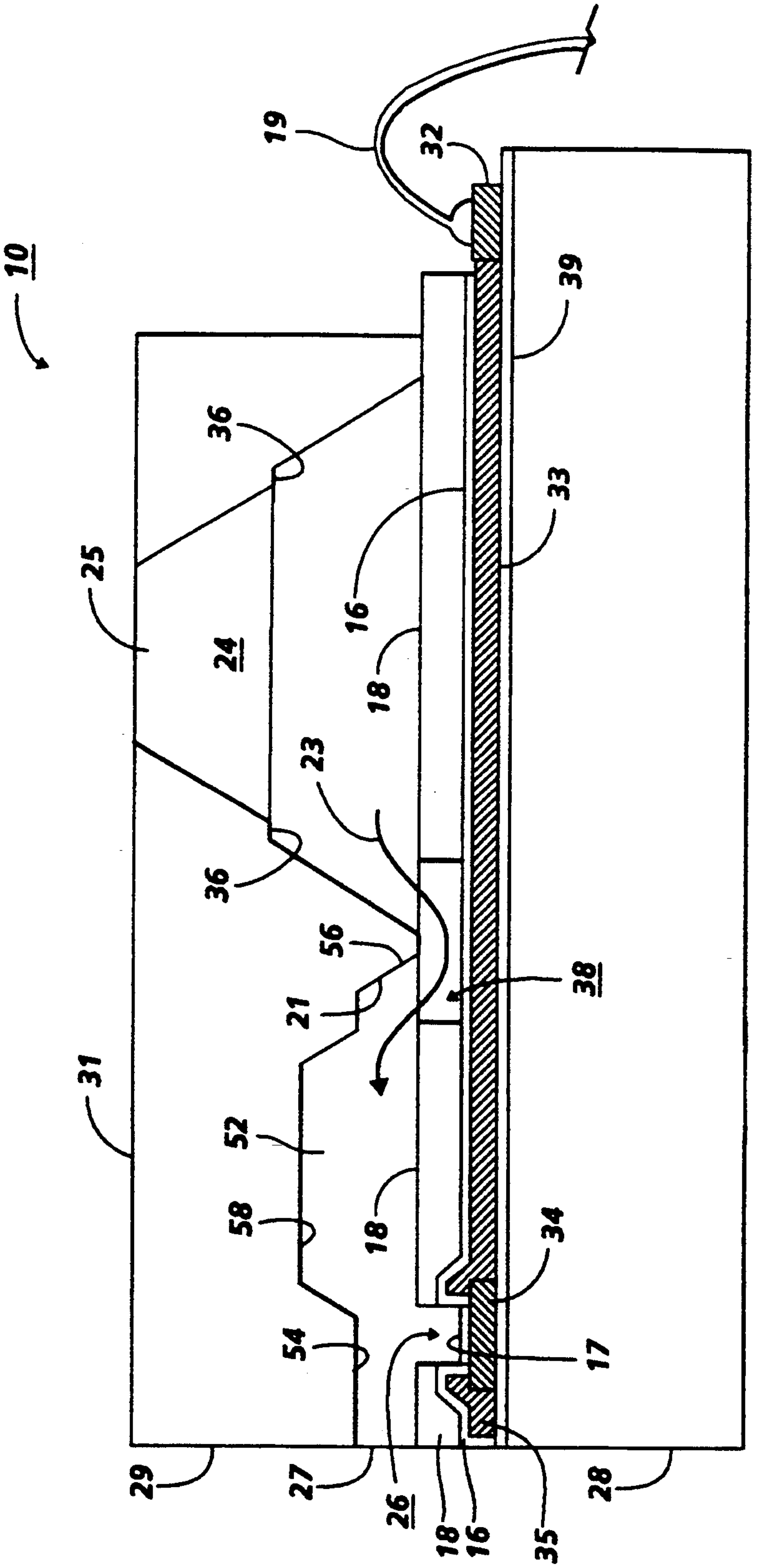
FIG. 4 is an enlarged, cross-sectional view of a printhead fabricated in accordance with the present invention.

FIG. 8 is a cross-sectional view of FIG. 2, as viewed along view line 8—8 thereof, and shows the wafer after the first, coarse anisotropic etching step. The wafer 40, the surface 41 of which is exposed by via 47 in the coarse etch mask or silicon nitride layer 44, is completely etched therethrough to form the reservoirs. Via 46 in silicon dioxide layer 42 is shown covered by the silicon nitride layer. The slanted wall 43 of anisotropically etched reservoir recess 24 lie in the {111} crystal planes of the wafer and undercut the coarse mask 44 slightly, generally about 6 to 8 $\mu m$, as indicated at 37. A border 45 of silicon nitride over the via 48 in the fine etch mask or silicon dioxide layer 42 prevents undercutting of the coarse mask from reaching the tighter toleranced, fine etch mask during the coarser etching of the reservoir recesses 24. After the coarse etching of the reservoir 24, the coarse etch mask of silicon nitride is removed exposing the first silicon dioxide layer 42, and this is the condition of the wafer shown in FIG. 2. The wafer 40 is then placed in a second anisotropic etch of, for example, KOH or EDP. The wafer is then etched for a predetermined time, and the surface of the wafer exposed through the silicon dioxide layer 42 is etched to produce channels 52 with varying cross-sectional areas and the shelf 36 in the reservoir 24, as shown in FIG. 3. Each channel has opposing ends 54, 56 and an enlarged portion 58 intermediate the opposing ends. The via extensions 50 of the vias 46 enable the anisotropic etchant to etch along the {111} planes, thus etching under the mask 42 toward the opposing ends of the channel vias 46, as shown in the portion of FIG. 3 having the silicon dioxide mask 42 thereon. The fine etch mask of silicon dioxide layer 42 has been removed from the remainder of the wafer exposing surface 41 thereof to show the fully etched channels recesses 52. As soon as the appropriate undercutting of the mask has been achieved at the extensions 50, as defined by the time the wafer is in the second or fine etchant, the wafer 40 is removed from the second anisotropic etchant, and the silicon dioxide mask layer is removed. The wafer is then aligned and bonded to a heater plate with patterned, thick film layer 18, and diced to produce a plurality of individual printheads, as shown in FIG. 4. FIG. 4 is identical with FIG. 1, except for the channels 52 which have enlarged portion 58 and the shelf 36 in the reservoir. The enlarged channel portions 58 also have a triangular cross-sectional shape.

Figure 5:
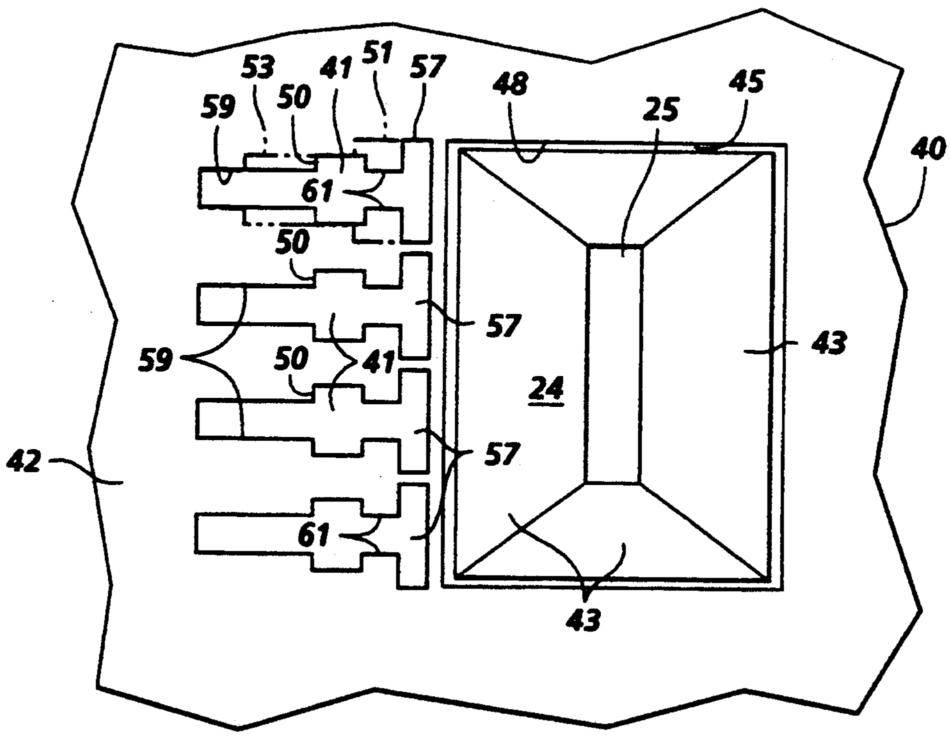
FIG. 5 is a partially shown plan view of the wafer after the coarse etching step and removal of the coarse etch mask snowing an alternate embodiment of a fine etch mask.
Figure 6:
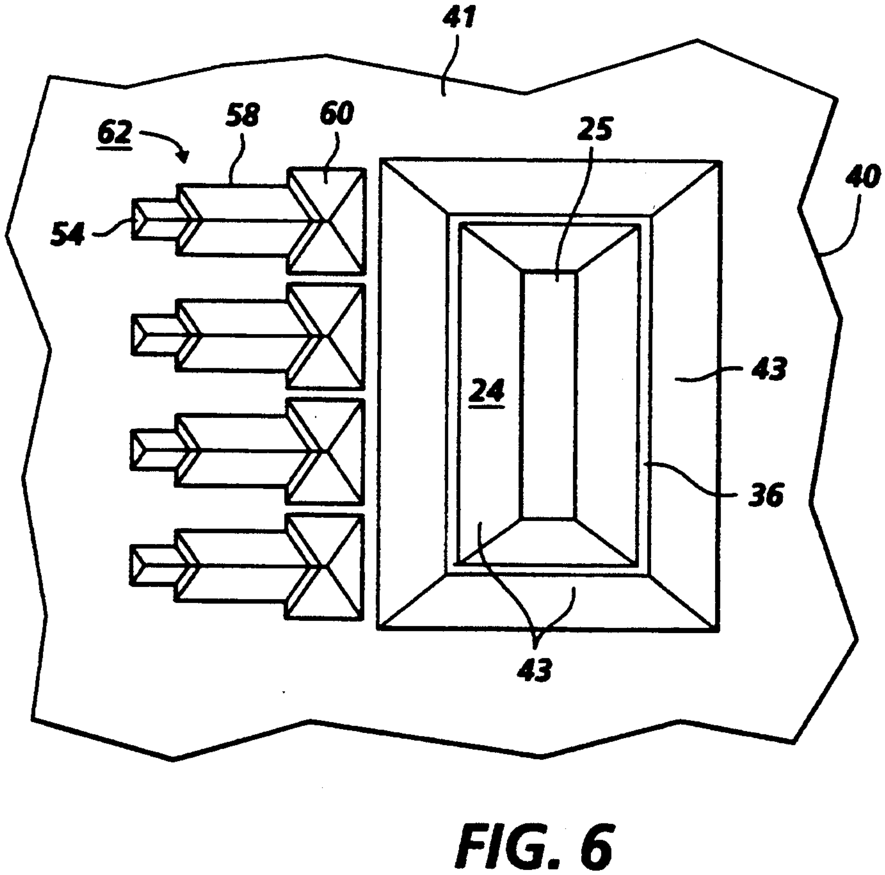
FIG. 6 is a view similar to FIG. 5 showing the etched channel recesses after the fine etching and removal of the fine etch mask.
Figure 7:
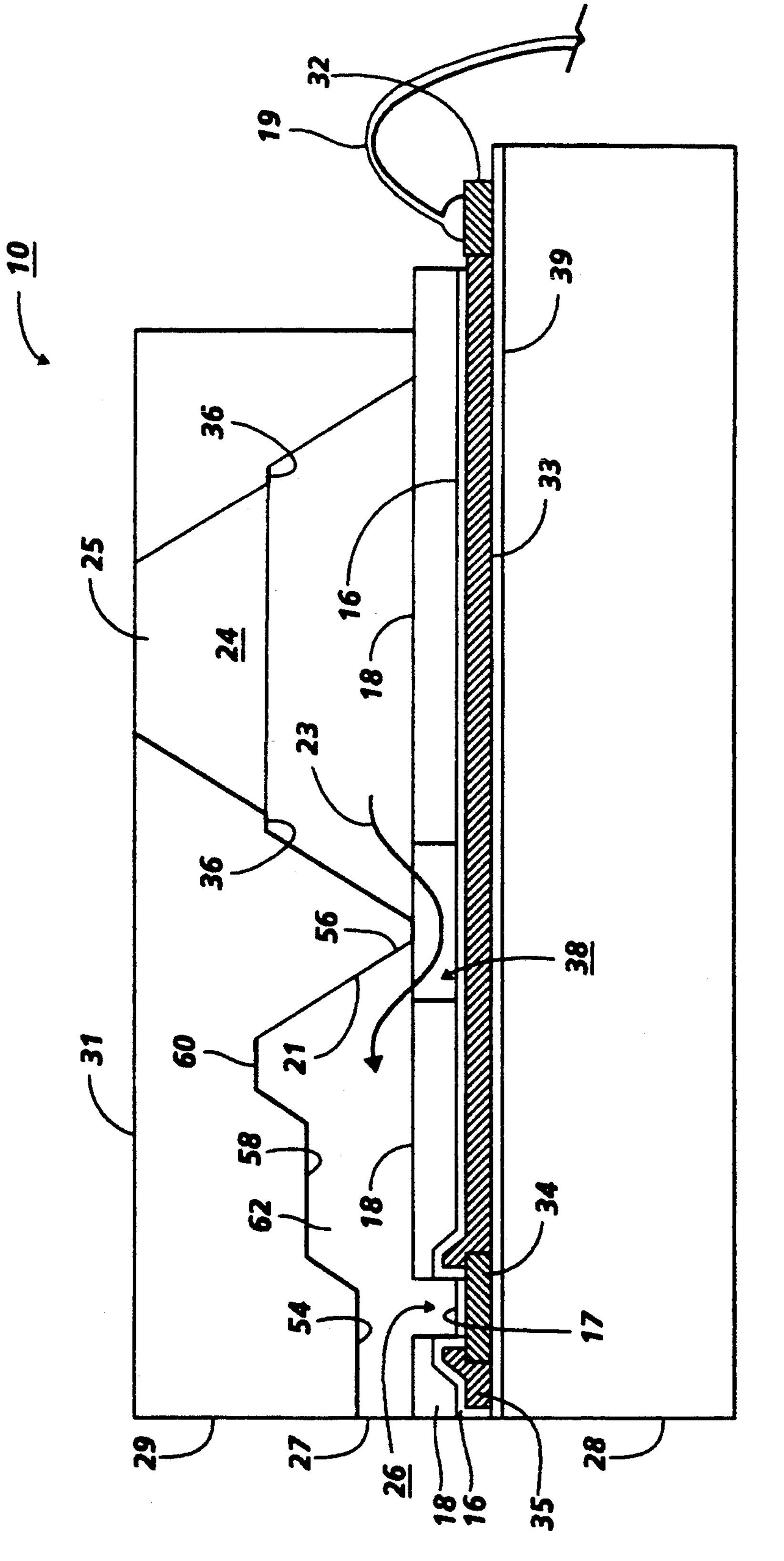
FIG. 7 is an enlarged, cross-sectional view of an ink jet printhead showing an alternate embodiment produced by the fine etch mask pattern of FIGS. 5 and 6.

An alternate embodiment is shown in FIGS. 5–7. FIG. 5 is a partially shown plan view of a wafer in which the coarsely etched reservoir recess 24 has been completed, and the coarse etch mask removed exposing the fine etch mask 42 with vias 59 therein and the border 45 of silicon wafer surface 41. Vias 59 are patterned for the fine etching of the channel recesses in wafer surface 41. The channel vias 59 in FIG. 5 are similar to the vias in FIG. 2, except that via end adjacent the reservoir recesses 24 have second opposing extensions 57 which extend out further than the extensions 50. After the coarse etching of the reservoir recess 24 and removal of the coarse etch mask, the wafer 40 is placed into a second anisotropic etchant, and the channels 62 are etched, as shown in FIG. 6. The extensions 50, 57, which extend from opposite sides of the via 59, permit planned undercutting of the mask to produce channel recess portions 51, 53, as shown in dashed line in FIG. 5. The spacing between via extensions 50 and 57 are designed so that the thin wall 61, initially formed between extensions 50, 57 during the fine anisotropic etching step, break down and are etched away before completion of the fine etching step to produce the channel recesses 62 shown in FIG. 6. When the desired etched recesses for the channels have been completed, the wafer is removed from the second anisotropic etchant, and the fine etch mask 42 is removed as shown in FIG. 6. Each channel recess 62 is similar to the channel recesses in FIG. 3., except that the channel recess portion 60 adjacent the reservoir recess 24 is larger. Thus, the channel recess portion 60 has the largest triangular cross-sectional area, the center channel recess portion 58 has a triangular cross-sectional area less than portion 60, and the end portion 54 has the smallest triangular cross-sectional area. The wafer with the plurality of sets of etched channel recesses 62 and associated reservoir recesses 24, as shown in FIG. 6, is aligned and bonded to the heater wafer in the same manner as discussed in FIG. 4, and the plurality of printheads are obtained by dicing the bonded wafers. FIG. 7 shows a cross-sectional view of a printhead according to the alternate embodiment, which is similar to that of FIG. 4 except that the varying shape of each ink channel 62 has a larger cross-sectional area 60 adjacent the reservoir recess 24, which is larger than intermediate recess portion 58. This configuration enables a faster refill time, thereby improving the frequency of firing the printhead.

Figure 9:
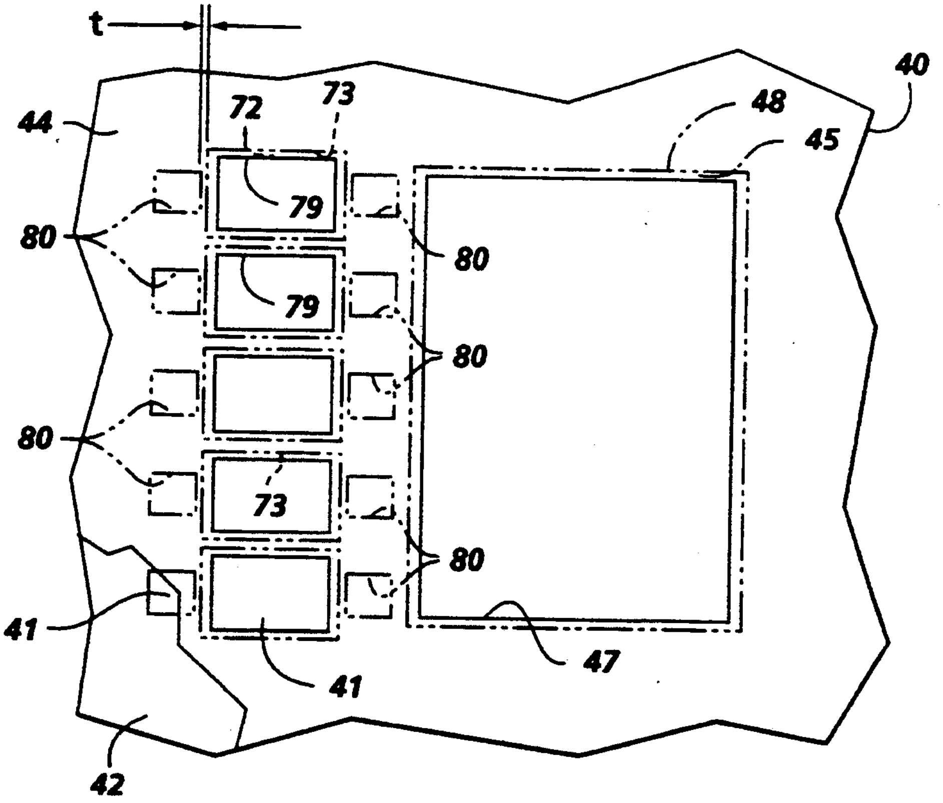
FIG. 9 is a partially shown plan view of the wafer showing the vias in the coarse mask of an alternate embodiment of the present invention prior to etching and showing the vias in the underlying fine mask in dashed line.
Figure 10:
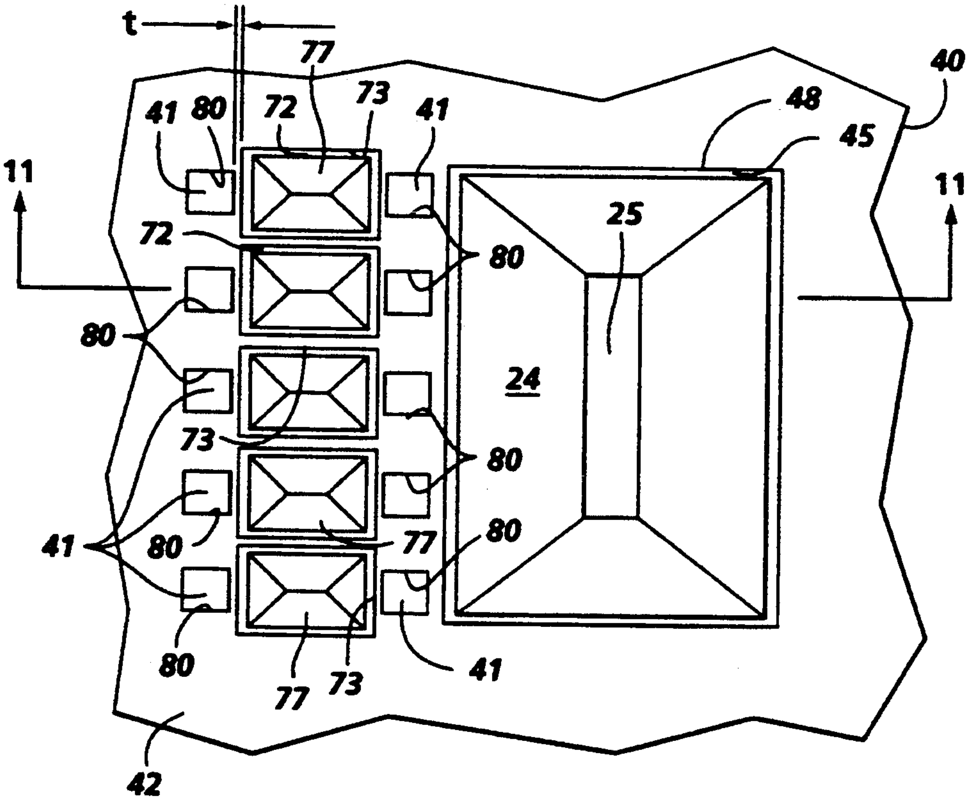
FIG. 10 is a partially shown plan view of FIG. 9 after the coarse etching and removal of the coarse mask, so that the fine mask and vias therein are shown, together with the coarsely etched recesses.
Figure 11:
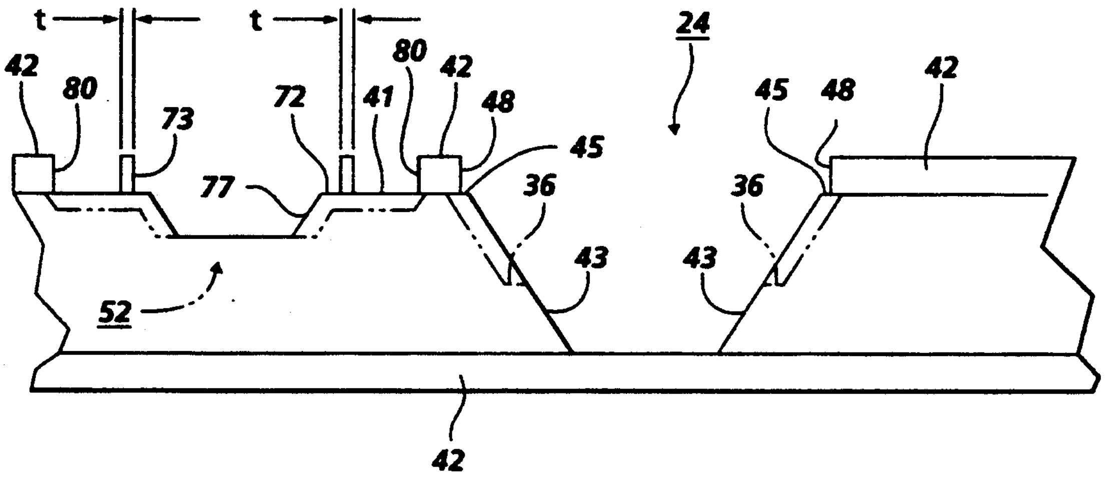
FIG. 11 is a partially shown, cross-sectional view of the wafer as viewed along view line 11—11 in FIG. 10.

Another embodiment is shown in FIGS. 9–11. FIG. 9 is a partially shown plan view of a silicon wafer 40, showing the coarse mask 44 with the vias 47 for the reservoirs 24 (FIG. 10) and the vias 79 for the enlarged central portions 77 of the subsequently etched channels 52 (shown in FIG. 4). FIG. 9 is similar to FIG. 2., except that the enlarged central portions of the channels are concurrently etched with the reservoir recesses during the coarse etch step. The fine mask 42 was deposited and patterned first. The via 47 in coarse mask 44 is within the boundary of via 48 in the fine mask 42 and also has the border 45 of coarse mask material to protect the fine mask from being reached by the undercutting of the coarse mask by the coarse etchant. A similar border 72 of coarse mask protects the via 73 in the fine mask for the enlarged central portion of the channels. Vias 80 in the fine mask on opposing sides of via 73 are spaced therefrom a predetermined distance "t" of about 6–12 μm to assure that the thin wall of silicon produced during the fine etching through vias 80 and 73 will erode away to connect the recesses etched during the fine etching step and produce the channels substantially identical to channels 52 of FIG. 4. The vias 80 adjacent the reservoir via 48 are spaced therefrom a predetermined distance to assure that the channels do not connect to the reservoir during the fine etching step. FIGS. 10 and 11 show the wafer 40 after completion of the coarse etching step and with the coarse mask removed to show the fine mask 42 with vias 80 exposing the surface 41 of the silicon wafer and to show vias 48 and 73 with borders 45 and 72, respectively, exposing wafer surface 41. The coarse etching step produced reservoir recesses 24 and channel portion recesses 77, which will be slightly enlarged because of the silicon borders 45 and 72 when exposed to the fine etchant. FIG. 11 is a cross-sectional view of the wafer shown in FIG. 10 as viewed along view line 11—11 thereof, and more clearly shows the spacing t between vias 80 and 73 which will permit undercutting by the fine etching step to produce the channels 52 show in dashed line and in the channel plate 31 of FIG. 4, but obtained by the above described alternate technique. The etching of shelves 36 in the reservoirs 24 by the fine etchant is also shown in FIG. 11 in dashed line.

Figure 12:
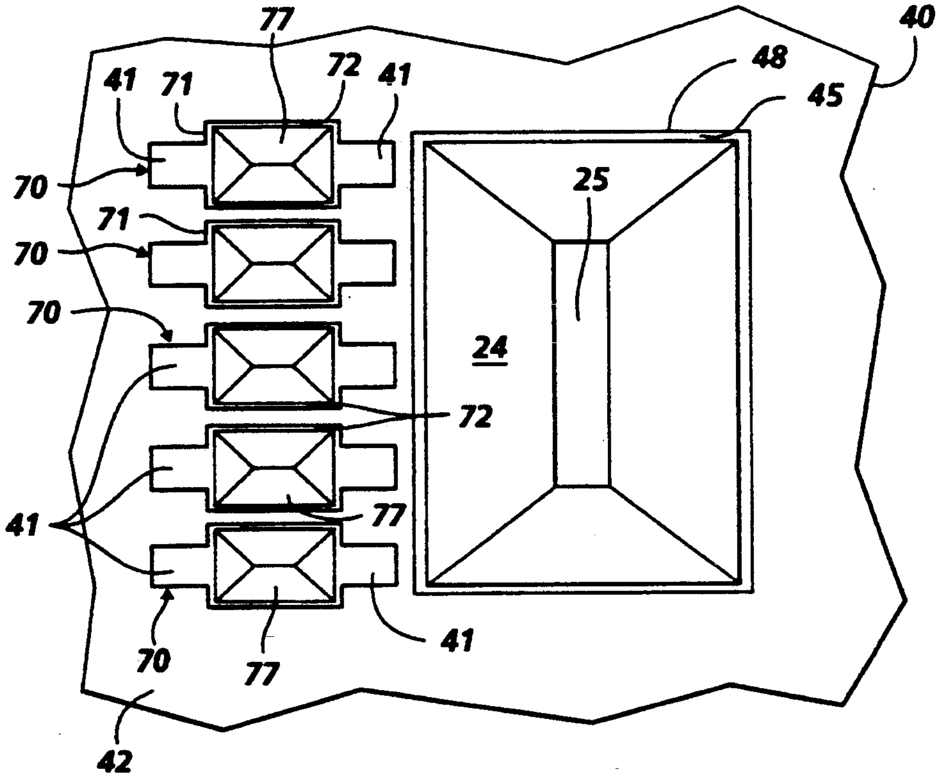
FIG. 12 is a partially shown plan view of the wafer after the coarse etching and removal of the coarse mask, in accordance with another embodiment of the present invention, so that fine mask and vias therein are shown as well as the coarsely etched recesses.

Another embodiment of the present invention is shown in FIG. 12 which is similar to the embodiment disclosed with respect to FIGS. 9–11. The difference is that the channel vias in the fine mask 42 is a single via 70 with opposing extensions 71 instead of a series of separate vias 80, 73. In FIG. 12, a partially shown plan view of a (100) silicon wafer is shown after the reservoir recess 24 and central enlarged portion 77 of the channel 52 (see FIG. 4) are concurrently coarsely etched and the coarse mask 44 is removed to expose the underlying fine etch mask 42 having channel vias 70 and reservoir recess 48 therein. Reservoir recess 48 in the fine mask 42 exposes a border 45 of wafer surface 41 and the channel vias 70 expose the wafer surface 41 therethrough, including a border 72 which surrounds the previously etched portion of the enlarged central portion 77 of the channels. The wafer of FIG. 12 is placed in a fine, anisotropic etchant and etched for a predetermined time. The extensions 71 of via 70 will provide a planned undercutting of the fine mask 42 as disclosed in FIG. 3 and will achieve a similar etched channel wafer, so that the mating, bonding, and dicing of the channel of FIG. 12 with a heater wafer (not shown) will produce a plurality of printheads substantially identical to those shown in FIG. 4.

Figure 13:
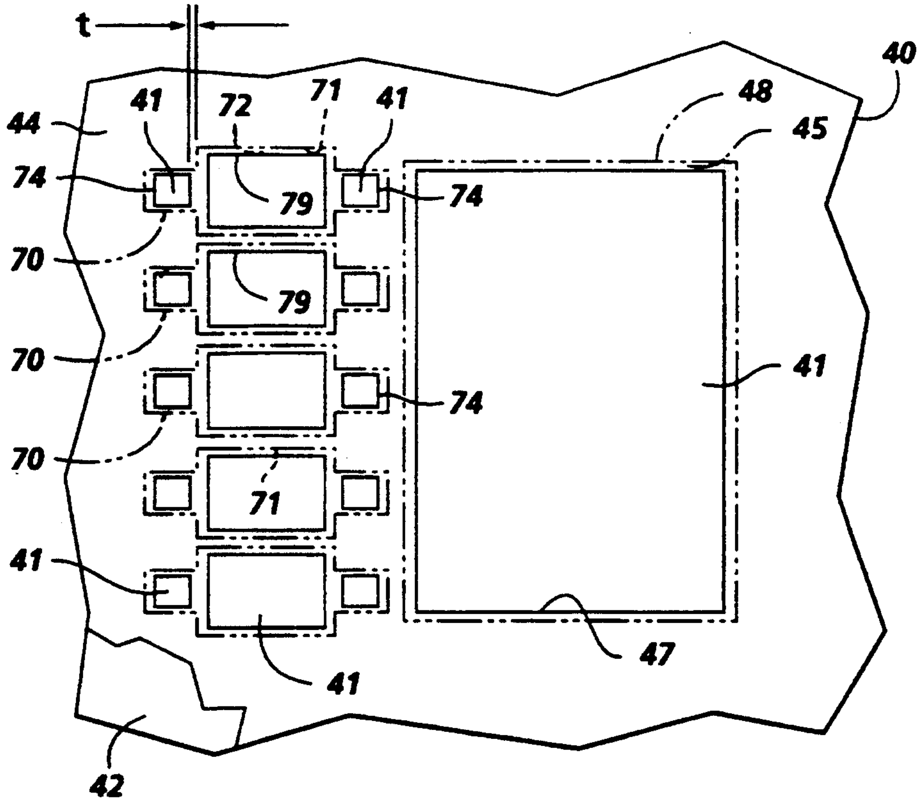
FIG. 13 is a partially shown plan view of the wafer showing the vias in the coarse mask of another embodiment of the present invention prior to etching and showing the vias in the underlying fine mask in dashed line.
Figure 14:
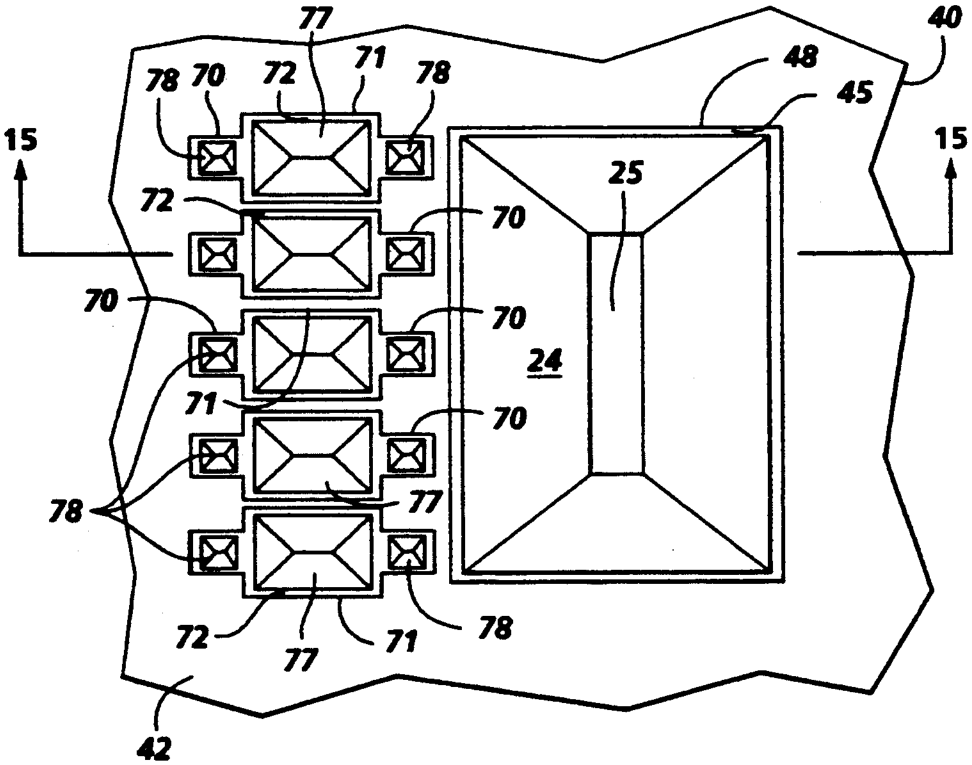
FIG. 14 is a partially shown plan view of FIG. 13 after the coarse etching and removal of the coarse mask, so that the fine mask and vias therein are shown, together with the coarsely etched recesses.
Figure 15:
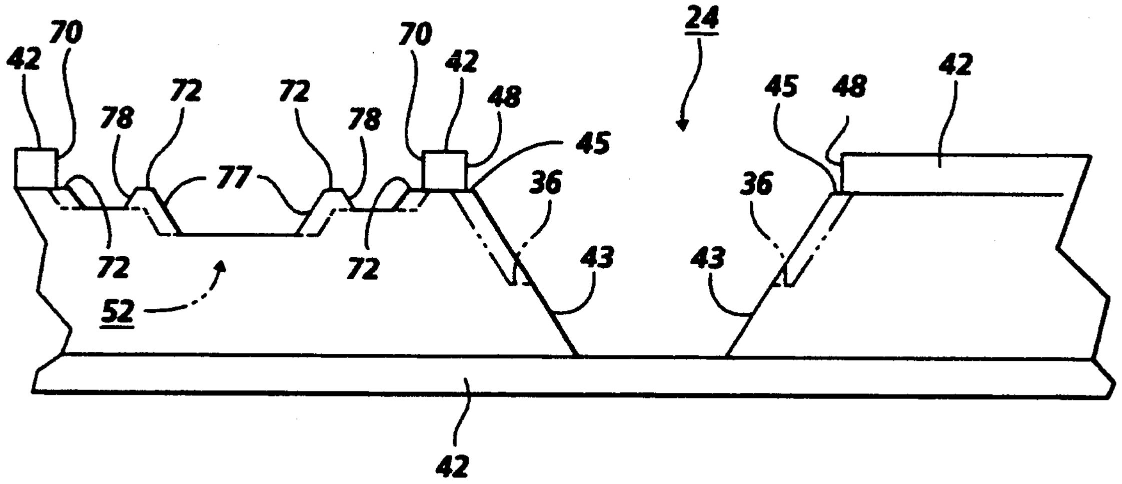
FIG. 15 is a partially shown, cross-sectional view of the wafer as viewed along view line 15—15 in FIG. 14.

Another embodiment of the present invention is shown in FIGS. 13–15. FIG. 13 is a partially shown plan view of a (100) silicon wafer 40 having the patterned second coarse mask on the wafer surface 41, which shows reservoir via 47 and a series of at least three separated vias 74, 79 therein, which represent the opposing channel end portions and the enlarged center channel portion, respectively. This embodiment of the fabrication method is similar to that of FIG. 12., except vias 74 are formed in the second or coarse mask 44 surrounded by via 70 in the first or fine mask 42, so that the opposing end portions 78 of the channels are concurrently coarsely etched with the center portion 77 and the reservoir recess 24. The vias 74 and 79 in the coarse mask 44 are surrounded by a border 72 for reasons discussed above. Thus, when the coarse mask is removed, a border 72 of silicon wafer surface 41 surrounds the coarsely etched channel portion recesses 77, 78. In this embodiment, less time in the fine or second anisotropic etchant will be required than in the embodiment of FIG. 12, since most of the channel recess etching was accomplished with the first or coarse etching step.

FIG. 15 is a partially shown, cross-sectional view of the wafer as viewed along view line 15—15 in FIG. 14 and shows the coarsely etched reservoirs 24 as segmented channel recesses which include the equal, opposing end portion recesses 78 and the larger center channel portion recess 77. With the coarse mask removed, the coarsely etched channel recesses 77, 78 and the silicon wafer 41 which provides the border 72 therearound are exposed through via 70 in the fine mask 42. Accordingly, there will be no delay in etching the exposed surfaces of the wafer or exposed recesses, and the second, fine anisotropic etchant will quickly etch the channels 52 into channels having a variable cross-sectional area substantially as shown in FIG. 4 and in dashed line in FIG. 15. The border 45 of wafer surface 41 will also etch to form a shelf 36, also shown in dashed line in FIG. 15. As in FIG. 12, the via extensions 71 will permit undercutting along the {111} crystal planes in directions towards the opposing channel ends. Removing the wafer 40 from the fine anisotropic etchant within a predetermined time stops the etching of the enlarged central channel portion 77 in the directions of the opposing channel ends, thereby defining the variable cross-sectional area of the channels 52.

Although the foregoing description illustrates the preferred embodiment as a thermal ink jet channel plate, other variations and other three-dimensional silicon structures are possible. All such variations and other structures as will be obvious to one skilled int the art, are intended to be included within the scope of this invention as defined by the following claims.

We claim:

1. A method of fabricating a three dimensional structure from a silicon wafer having at least one recess with a variable cross-sectional area, the wafer having a thickness and two opposing, substantially parallel surfaces, the fabricating method comprising the steps of:

forming a first layer of etch resistant material on both surfaces of the wafer;

patterning the first layer of etch resistant material on one of the wafer surfaces to delineate a plurality of vias, said vias exposing the surface of the wafer, at least one of the vias having opposing ends and sides with opposing via extensions extending in opposite directions from each via side at a location therealong;

depositing a second layer of etch resistant material on both sides of the wafer and over the first layer of etch resistant material and vias therein;

patterning the second layer of etch resistant material on the same wafer surface as that patterned in the first layer of etch resistant material to produce at least one via within a boundary of one of the vias in said first layer of etch resistant material to expose the silicon wafer surface;

placing the wafer into a first anisotropic etchant to etch coarsely the wafer to produce at least one recess in the wafer through the vias in the second layer of etch resistant material;

removing the second layer of etch resistant material from the wafer to expose the first layer of etch resistant material and the vias in said one surface thereof which expose the wafer surface through said vias;

placing the wafer into a second anisotropic etchant for a time period to produce relatively fine recesses in the exposed wafer surface through the vias in the first layer of etch resistant material, the extensions on opposing sides of said at least one recess causing the second etchant to etch along the {111} crystal planes, so that the second etchant etches under the via extensions of said at least one via in the etch resistant material in opposing directions towards the recess ends, thereby enlarging the recess cross-sectional area intermediate the via ends while the wafer is in the second etchant; and removing the wafer from the second anisotropic etchant within a time period sufficient to stop the etching under the first layer of etch resistant material to delineate a recess shape having a different cross-sectional area at each end than at a location intermediate the etched recess ends.

2. The method of claim 1, wherein the first layer of etch resistant material is a thermally grown silicon dioxide $SiO_2$ having a thickness of about 5000–7500 Å; wherein the second layer of etch resistant material is silicon nitride ($Si_3N_4$) having a thickness of about 0.1–0.2 μm; and wherein each said at least one via in the $Si_3N_4$ is positioned within one of the vias in the $SiO_2$, so that a border exists between the internal boundary of the via in the $Si_3N_4$ and the internal boundary of the via in the $SiO_2$.

3. The method of claim 2, wherein the plurality of vias in the first layer of etch resistant material are a plurality of sets of parallel channel vias and at least one reservoir via for each set of channel vias; wherein each channel via has said opposing via extensions of extending in opposite directions from each channel via at a location therealong, the reservoir being located adjacent one end of the channel vias and being sized to enable subsequent anisotropic etching through said wafer; and wherein the at least one via in said second layer of etch resistant material is located within the at least one reservoir vias in the first etch resistant layer, so that a border of second etch resistant material prevents exposure of the first etch resistant material to the anisotropic etchant used to etch through the at least one via in the second etch resistant material.

4. The method of claim 3, wherein the three dimensional structure is a plurality of channel plates integrally formed in said wafer for assembly with a plurality of heater plates integrally formed in a second wafer to produce a quantity of ink jet printheads which may be separated into a plurality of individual printheads by a dicing operation.

5. The method of claim 4, wherein second opposing via extensions extending from opposing sides of each channel via are located at and coincident with the channel via end which is adjacent the reservoir via, said second via extensions extend from the channel via a greater distance than the first opposing via extensions so that after the two etching steps have been completed, the cross-sectional area of the channel recess end adjacent the reservoir recess will be larger than the cross-sectional area of the intermediate portion of the channel recess and the cross-sectional area of the channel recess end opposite the one adjacent the reservoir recess will be smaller than the cross-sectional area of the intermediate portion of the channel recess.

6. The method of claim 4, wherein the patterning of the second layer of etch resistant material includes a second via within a portion of each channel via in the first layer of etch resistant material defined by the channel via and opposing extensions therefrom, so that a boundary of the second layer of etch resistant material prevents the first anisotropic etchant from reaching the first layer of etch resistant material by undercutting of the second layer of etch resistant material.

7. The method of claim 6, wherein each of the channel vias in said first layer of etch resistant material are segmented into a center via having opposing ends and a length and two vias on opposing ends of the center via, the center via containing the extensions which extend the length of the center via, the spacing between the center via and the two vias on opposing ends thereof being a dimension to insure complete undercutting by second anisotropic etchant, so that the subsequently etched channel is connected.

8. The method of claim 6, wherein the patterning of the second layer of etch resistant material includes a third and fourth via within each channel via in the first layer of etch resistant material.

* * * * *